(12) United States Patent
Hiyama

(10) Patent No.: US 12,409,409 B2
(45) Date of Patent: Sep. 9, 2025

(54) CONDENSATION DEVICE, FLUX RECOVERY DEVICE, SOLDERING DEVICE, WATER VAPOR REMOVING METHOD, FLUX RECOVERY METHOD AND SOLDER PROCESSING METHOD

(71) Applicant: SENJU METAL INDUSTRY CO., LTD., Tokyo (JP)

(72) Inventor: Tsutomu Hiyama, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 989 days.

(21) Appl. No.: 17/600,567

(22) PCT Filed: Mar. 6, 2020

(86) PCT No.: PCT/JP2020/009608
§ 371 (c)(1),
(2) Date: Sep. 30, 2021

(87) PCT Pub. No.: WO2020/203033
PCT Pub. Date: Oct. 8, 2020

(65) Prior Publication Data
US 2022/0126236 A1   Apr. 28, 2022

(30) Foreign Application Priority Data
Apr. 5, 2019   (JP) ................. 2019-072420

(51) Int. Cl.
*B23K 1/00*   (2006.01)
*B01D 5/00*   (2006.01)
(Continued)

(52) U.S. Cl.
CPC ......... *B01D 53/265* (2013.01); *B01D 5/0003* (2013.01); *B01D 5/0012* (2013.01);
(Continued)

(58) Field of Classification Search
CPC ....... B01D 53/265; B23K 1/008; F28D 7/106; F28D 2021/0038; F28F 1/24
See application file for complete search history.

(56) References Cited

U.S. PATENT DOCUMENTS

| | | | | |
|---|---|---|---|---|
| 4,638,852 A | * | 1/1987 | Basseen ............... | B01D 53/265 165/47 |
| 6,385,978 B1 | * | 5/2002 | Elliott .................. | B01D 53/265 62/93 |

(Continued)

FOREIGN PATENT DOCUMENTS

| | | |
|---|---|---|
| CN | 104673331 B | 9/2016 |
| DE | 3300929 A * | 7/1984 |

(Continued)

OTHER PUBLICATIONS

Extended European Search Report for corresponding EP Application 20783006.8, dated Nov. 7, 2022 (9 pages).

(Continued)

*Primary Examiner* — Eric S Ruppert
(74) *Attorney, Agent, or Firm* — Harness, Dickey & Pierce, P.L.C.

(57) ABSTRACT

Provided is a condensation device capable of removing water vapor from a larger amount of gas without making a size larger than in related art. A condensation device 700 according to the present invention includes an outer cooling unit 720 including one or two or more inner tubes 722, an outer tube 724 located outside the one or two or more inner tubes 722, and a first flow path 726 through which a first cooling medium passes between the one or two or more inner tubes 722 and the outer tube 724.

22 Claims, 6 Drawing Sheets

(51) Int. Cl.
    *B01D 53/00*      (2006.01)
    *B01D 53/26*      (2006.01)
    *B23K 3/08*      (2006.01)
    *F28D 7/00*      (2006.01)
    *F28D 7/12*      (2006.01)
    *F28D 7/16*      (2006.01)
    *F28F 1/24*      (2006.01)
    *F28F 9/02*      (2006.01)
    *H05K 3/34*      (2006.01)

(52) U.S. Cl.
    CPC ......... *B01D 5/0039* (2013.01); *B01D 53/002* (2013.01); *B23K 3/082* (2013.01); *F28D 7/0083* (2013.01); *F28D 7/12* (2013.01); *F28D 7/16* (2013.01); *F28F 1/24* (2013.01); *B01D 2221/14* (2013.01); *B01D 2257/80* (2013.01); *F28F 9/0258* (2013.01); *H05K 3/3494* (2013.01)

(56) References Cited

U.S. PATENT DOCUMENTS

| | | |
|---|---|---|
| 6,994,833 B1 | 2/2006 | Nishimura et al. |
| 2016/0279726 A1* | 9/2016 | Hiyama ............... B23K 3/0653 |

FOREIGN PATENT DOCUMENTS

| | | |
|---|---|---|
| DE | 19653613 A1 | 6/1998 |
| EP | 3064304 A1 | 9/2016 |
| GB | 260066 A * | 10/1926 |
| JP | S56-010904 U | 1/1981 |
| JP | 2004-327893 A | 11/2004 |
| JP | 2006-284004 A | 10/2006 |
| JP | 2011-060856 A | 3/2011 |
| JP | 5761467 B1 | 8/2015 |
| WO | WO-2015-064143 A1 | 5/2015 |

OTHER PUBLICATIONS

Office Action issued in JP-2019-072420 dated Oct. 25, 2019 (with English Translation) (10 pages).

Office Action issued in JP-2019-072420 dated Feb. 6, 2020 (with English Translation) (8 pages).

Office Action issued in JP-2019-072420 dated Apr. 6, 2020 (with English Translation) (10 pages).

Office Action issued in JP-2019-072420 dated Aug. 20, 2020 (with English Translation) (14 pages).

International Search Report (in English and Japanese) of the International Searching Authority issued in PCT/JP2020/009608, mailed Apr. 14, 2020; ISA/JP.

* cited by examiner

CONDENSATION DEVICE, FLUX RECOVERY DEVICE, SOLDERING DEVICE, WATER VAPOR REMOVING METHOD, FLUX RECOVERY METHOD AND SOLDER PROCESSING METHOD

CROSS REFERENCE TO RELATED APPLICATIONS

This application is a U.S. National Phase Application under 35 U.S.C. 371 of International Application No. PCT/JP2020/009608 filed on Mar. 6, 2020, which claims the benefit of priority from Japanese Patent Application No. 2019-072420 filed Apr. 5, 2019. The entire disclosures of all of the above applications are incorporated herein by reference.

TECHNICAL FIELD

The present invention relates to a condensation device, a flux recovery device, a soldering device, a water vapor removing method, a flux recovery method and a solder processing method.

BACKGROUND ART

In a case of soldering an electronic component to a circuit board, a soldering device such as a reflow furnace or a jet soldering device is used. When the soldering is performed, flux is applied to a soldering location of the circuit board. The flux is applied to remove an oxide film of a metal surface to be soldered, and to prevent the metal surface from being re-oxidized during heat treatment in a soldering process. The flux is obtained mainly by dissolving a solid component such as rosin, thixotropic agent, or activator in solvent. In a case of applying the flux to the circuit board, for example, in a case of using the reflow furnace, solder paste obtained by mixing and pasting flux and solder powder is used, and in a case of using the jet soldering device, flux is applied directly to the board with a fluxer.

When the flux is applied as the solder paste or with the fluxer, especially the solvent in a flux component vaporizes to form flux fume in a preheating unit before the soldering. In a main heating unit where the soldering is performed, especially a solid component such as rosin in the flux component vaporizes to form the flux fume that floats in the device. When these flux fumes come in contact with a part having a comparatively low temperature in the device, for example, a chain conveyor that conveys the circuit board, the fumes are cooled and condensed, and when temperature further drops, a sticky solid is formed. This solid adheres and is deposited onto each part in the soldering device, and the device might cause a defect. For example, in a case where a large amount of solid adheres on the chain conveyor, the circuit board does not leave the conveyor and is caught up in a sprocket of the conveyor, and the circuit board is damaged. Further, when the solid adheres on the circuit board being conveyed, the circuit board is stained. Therefore, a flux recovery device is used to separate and remove the flux component from a gaseous mixture of atmosphere in the soldering device or inert atmosphere of nitrogen or the like and the flux component.

Here, an example of the flux recovery device is described in Patent Literature 1. The flux recovery device described in PTL1 includes a first water spray unit that sprays water to the gaseous mixture, and a separation unit that separates the flux component from the gaseous mixture. Also, the separation unit comprises an introduction part that introduces the gaseous mixture into an upper part, a flux component separating tubular body including an upper opening and a lower conical portion, and a lid engaged in the opening in the tubular body. Furthermore, the lid includes a disc-shaped main body, and a cylindrical portion for exhaust having a predetermined length is provided to penetrate the main body.

According to this flux recovery device, when the gaseous mixture is taken into the introduction part from a tangential direction of the tubular body, the gaseous mixture is mixed with water to form a swirling flow. Then, the flux contained in the gaseous mixture is cooled with water supplied into the separation unit. Consequently, most of the flux starts to be liquefied and solidified, and the flux is coated with the sprayed water. That is, flux is mixed with water, and removed as water containing flux from the gaseous mixture. Afterward, gas from which flux is removed is sucked out from the cylindrical portion. Consequently, this flux recovery device can separate the flux from the gaseous mixture.

Furthermore, water is for use in separating flux, and hence gas from which flux is removed contains a lot of water vapor. When water vapor generated in a separation process flows into a solder processing unit, the water vapor condenses and becomes waterdrops in a low temperature part of the solder processing unit. When the waterdrops adhere on an interior of the furnace, rusting is caused. Also, when the waterdrops adhere on the circuit board, the circuit board absorbs moisture. The circuit board that absorbs moisture is heated during solder processing, and thereby the moisture absorbed evaporates. This evaporation of water might cause a phenomenon where solder in a soldered region scatters. When the solder scattering occurs, a soldering defect that the scattered solder causes an electrical short circuit across terminals, that is, so-called solder bridge is caused. Further, the circuit board that absorbs moisture might be a factor that causes deterioration of the soldered region due to changes over years, or migration. The water vapor that enters the furnace might cause defects related to reliability of the circuit board. Furthermore, water to be reused might decrease. To solve this problem, this flux recovery device further includes condensation means for removing water vapor from the gas from which flux is removed. In PTL 1, as the condensation means, water-cooled coil type condensation means and air-cooled multi-tube type condensation means are disclosed.

The water-cooled coil type condensation means is a box body, and comprises a coiled pipe having satisfactory thermal conductivity inside the box body. Then, in the water-cooled coil type condensation means, liquid such as water flows into the coiled pipe, to cool a surface of the pipe. Consequently, when the gas containing water vapor passes through an interior of the box body of this condensation means, the gas is cooled and condensed by the coiled pipe inside the box body. Then, through the condensation, water vapor is removed from the gas containing water vapor.

Also, the air-cooled multi-tube type condensation means is a box body, and includes a pipe group including one or more pipes inside the box body. Then, cold air flows through interiors of the pipes in the group, to cool surfaces of the pipes in the group. Consequently, when the gas containing water vapor passes through the interior of the box body of this condensation means, the gas is cooled and condensed by the pipe group inside the box body. Then, through the condensation, water vapor is removed from the gas containing water vapor.

Therefore, in the flux recovery device described in PTL 1, dry gas can be generated from the gas containing water vapor by use of the water-cooled coil type condensation means or the air-cooled multi-tube type condensation means. Consequently, this flux recovery device can collect flux from the gaseous mixture containing the flux component that is generated in the solder processing unit, and supply the dry gas to the solder processing unit again.

CITATION LIST

Patent Literature

PTL 1: Japanese Patent No. 5761467

SUMMARY OF INVENTION

Technical Problem

As described above, a flux recovery device described in PTL 1 comprises condensation means, to remove water vapor from gas containing water vapor, the gas being generated during recovery of flux. An amount of the gas containing water vapor that can be treated with the condensation means is related with an amount of the gaseous mixture that can be treated with the flux recovery device, and is therefore important.

However, in two condensation means described above, the gas containing water vapor is cooled mainly by a coiled pipe or a pipe group inside a box body. Consequently, to increase the amount of the gas containing water vapor that can be treated per unit time by the condensation means, a length of the coiled pipe is required to be increased, or a number of pipes constituting the pipe group is required to be increased. In this case, there is concern that the condensation means itself increases in size and that the flux recovery device or a soldering device including this condensation means also increases in size.

Therefore, in view of the above-described problems, an object of the present invention is to provide a condensation device, a flux recovery device, a soldering device, a water vapor removing method, a flux recovery method and a solder processing method that are capable of removing water vapor from a larger amount of gas without making a size larger than in related art.

Solution to Problem (Aspect 1)
A condensation device according to Aspect 1 comprises an outer cooling unit including one or two or more inner tubes, an outer tube located outside the one or two or more inner tubes, and a first flow path through which a first cooling medium passes between the one or two or more inner tubes and the outer tube.

In the condensation device according to Aspect 1, in a case where gas containing water vapor is distributed inside the inner tube of the outer cooling unit, the gas containing water vapor comes in contact with the inner tube of the outer cooling unit. Consequently, the gas containing water vapor is cooled by the inner tube of the outer cooling unit. Therefore, this condensation device can condense water vapor, and remove water vapor from the gas containing water vapor. Particularly in a case where the condensation device according to Aspect 1 comprises plural inner tubes, the device can cool the gas containing water vapor more quickly, and remove water vapor from a large amount of gas without making a size larger than in related art.

(Aspect 2)
In a condensation device according to Aspect 2, the condensation device according to Aspect 1 further comprises a heat absorption member that is located inside at least one inner tube in the one or two or more inner tubes, and that comes in contact with the outer cooling unit.

In the condensation device according to Aspect 2, the gas containing water vapor is cooled by the outer cooling unit and the heat absorption member. Consequently, in the condensation device according to Aspect 2, a surface area of a part that cools the gas containing water vapor increases as compared with condensation means of PTL 1. Therefore, this condensation device can remove water vapor from a larger amount of gas without making a size larger than in the related art, due to increase in contact area with the gas.

(Aspect 3)
In a condensation device according to Aspect 3, the condensation device according to Aspect 1 or Aspect 2 further comprises an inner cooling unit located inside the one or two or more inner tubes and including a second flow path through which a second cooling medium passes.

In the condensation device according to Aspect 3, the gas containing water vapor is cooled by the inner tube of the outer cooling unit and the inner cooling unit. Consequently, in the condensation device according to Aspect 3, the surface area of the part that cools the gas containing water vapor increases as compared with the condensation means of PTL 1. Therefore, this condensation device can remove water vapor from a larger amount of gas without making a size larger than in the related art, due to the increase in contact area with the gas.

(Aspect 4)
In a condensation device according to Aspect 4, the condensation device according to Aspect 3 further comprises a heat absorption member that is located inside the one or two or more inner tubes and outside the inner cooling unit, and that comes in contact with the inner cooling unit.

In the condensation device according to Aspect 4, the gas containing water vapor is cooled by the inner tube of the outer cooling unit, the inner cooling unit and the heat absorption member. That is, in this condensation device, the surface area of the part that cools the gas containing water vapor increases more than in the condensation device according to Aspect 3. Therefore, this condensation device can cool the gas containing water vapor more quickly due to the increase in contact area with the gas.

(Aspect 5)
According to a condensation device of Aspect 5, in the condensation device according to Aspect 4, the heat absorption member includes a plurality of fins.

In the condensation device according to Aspect 5, with the plurality of fins, a contact area of a fin that comes in contact with the gas containing water vapor can increase more than with one fin. That is, this condensation device can cool the gas containing water vapor more quickly due to the increase in contact area.

(Aspect 6)
According to a condensation device of Aspect 6, in the condensation device according to Aspect 4 or Aspect 5, the inner cooling unit has a straight tube shape, the inner tube of the outer cooling unit extends in an axial direction of the straight tube shape of the inner cooling unit, and the heat absorption member includes a first fin having a thin plate shape extending in a direction intersecting the axis.

In flowing gas, gas flowing through the vicinity of the inner tube of the outer cooling unit, the inner cooling unit and the heat absorption member is cooled more than gas flowing through a position away from the inner tube of the outer cooling unit, the inner cooling unit and the heat absorption member. Consequently, in a case where the gas containing water vapor does not provide convection in an interior of the inner tube of the outer cooling unit, a difference in temperature might be made in gas to be discharged depending on a position through which the gas containing water vapor flows. In this case, there is concern that gas that is not cooled and still contains a lot of water vapor passes through the condensation device.

However, according to the condensation device of Aspect 6, the first fin is disposed extending in a direction intersecting the axis. That is, the first fin is oriented to block the flow of the gas containing water vapor. Consequently, when the gas containing water vapor collides with the first fin, the convection of gas occurs in the interior of the inner tube of the outer cooling unit. In consequence, this condensation device can uniformly cool the gas containing water vapor. That is, this condensation device can inhibit the gas still containing a lot of water vapor from being passed through the condensation device.

(Aspect 7)

According to a condensation device of Aspect 7, in the condensation device according to Aspect 6, the first fin has a shape in which a bow-shaped cutout is formed in a thin disc shape, the heat absorption member further comprises a second fin having the same shape as in the first fin, disposed adjacent to the first fin via a space, and located on a downstream side of the first fin, and an extending direction of a chord forming the bow shape of the cutout in the first fin is different from an extending direction of a chord forming a bow shape of a cutout in the second fin.

In a case where two fins having the same shape are arranged in parallel via a space and gas is blown from a direction facing a plate surface of each fin, wind is hard to flow between the two fins, and gas between the two fins might stay. Consequently, in the case where the two fins are arranged in parallel in the condensation device, gas stays between the two fins, this gas is only cooled, gas at another position is hard to cool. However, according to the condensation device of Aspect 7, the bow-shaped cutouts are formed in the first fin and the second fin, respectively, and the extending direction of the chord forming the bow shape of the first fin is different from the extending direction of the chord forming the bow shape of the second fin. Therefore, in a case where gas passing through a portion of the first fin in which the cutout is formed flows straight forward, at least part of this gas collides with the second fin. This causes the convection of gas between the first fin and the second fin. That is, the gas between the first fin and the second fin is inhibited from staying. Therefore, this condensation device can make uniform a temperature of gas in the vicinity of the first fin and the second fin.

(Aspect 8)

A flux recovery device according to Aspect 8 is a flux recovery device that recovers flux from a gaseous mixture containing a flux component, and comprises a separation unit that separates flux from the gaseous mixture by use of water, and discharges gas containing water vapor and water containing flux, and the condensation device according to any one of Aspects 1 to 7 that removes water vapor from the gas discharged from the separation unit.

Since the flux recovery device according to Aspect 8 comprises the condensation device according to any one of Aspects 1 to 7, this condensation device can remove water vapor from a larger amount of gas without making a size larger than in the related art in the same manner as in Aspect 1. Consequently, this flux recovery device can remove water vapor from a larger amount of gas without making a size larger than in the related art, due to increase in amount of gas to be treated by the condensation device.

(Aspect 9)

In a flux recovery device according to Aspect 9, the flux recovery device according to Aspect 8 further comprises a purification device to which the water containing flux that is discharged from the separation unit is supplied, and that separates flux from the water containing flux, and recovers flux, and a piping that supplies water separated from flux and purified in the purification device from the purification device to the condensation device, and at least one of the first cooling medium and the second cooling medium is water supplied from the purification device.

The flux recovery device according to Aspect 9 uses water purified in the purification device as at least one of the first cooling medium and the second cooling medium. Consequently, the flux recovery device does not have to comprise another facility to supply a cooling medium for use in the first cooling medium and the second cooling medium, in addition to the purification device.

(Aspect 10)

In a flux recovery device according to Aspect 10, the flux recovery device according to Aspect 9 further comprises a pump that supplies the water purified in the purification device to the separation unit, a chiller unit that cools the water purified in the purification device, and a blower that blows, from the condensation device, the gas from which water vapor is removed in the condensation device.

The flux recovery device according to Aspect 10 can use the water purified in the purification device as water for use by the separation unit in separating flux from a gaseous mixture. Also, the chiller unit can cool water for use in separating flux, and water for use in the first cooling medium and the second cooling medium.

(Aspect 11)

In a flux recovery device according to Aspect 11, the flux recovery device according to any one of Aspects 8 to 10 comprises a plurality of the condensation devices connected to one another.

Since the flux recovery device according to Aspect 11 comprises the plurality of condensation devices connected to one another, water vapor can be removed from a larger amount of gas as compared with a case where the flux recovery device comprises one condensation device.

(Aspect 12)

A soldering device according to Aspect 12 comprises, a solder processing unit, and the flux recovery device according to any one of Aspects 8 to 11 that recovers flux from a gaseous mixture containing flux generated in the solder processing unit.

Since the soldering device according to Aspect 12 comprises the flux recovery device according to any one of Aspects 8 to 11, the flux recovery device provided in the soldering device can remove water vapor from a larger amount of gas without making a size larger than in the related art, in the same manner as in Aspect 8. Consequently, this soldering device can remove water vapor from a larger amount of gas without making the size larger than in the related art.

(Aspect 13)

A water vapor removing method according to Aspect 13 comprises the steps of allowing a first cooling medium to pass through a first flow path between one or two or more inner tubes and an outer tube in an outer cooling unit including the one or two or more inner tubes and the outer tube located outside the one or two or more inner tubes, and allowing, in interiors of the one or two or more inner tubes, condensation of water vapor contained in gas flowing through the interiors of the one or two or more inner tubes, to remove water vapor contained in the gas.

According to the water vapor removing method according to Aspect 13, the gas containing water vapor comes in contact with the inner tube of the outer cooling unit, so that the inner tube of the outer cooling unit can cool the gas containing water vapor. Therefore, this water vapor removing method is capable of condensing water vapor, and removing water vapor from the gas containing water vapor. In particular, in a case where the outer cooling unit according to Aspect 13 comprises plural inner tubes, the gas containing water vapor can be cooled more quickly, and the water vapor can be removed from a larger amount of gas without making a size larger than in the related art.

(Aspect 14)

In a water vapor removing method according to Aspect 14, the method according to Aspect 13 further comprises the steps of allowing a second cooling medium to pass through a second flow path included in an inner cooling unit located inside the one or two or more inner tubes, and cooling, by a heat absorption member, gas flowing through an interior of the inner tube, the heat absorption member being located inside the one or two or more inner tubes of the outer cooling unit and outside the inner cooling unit, the heat absorption member coming in contact with at least one of the outer cooling unit and the inner cooling unit.

According to the water vapor removing method according to Aspect 14, each of the inner tube of the outer cooling unit, the inner cooling unit and the heat absorption member can cool the gas containing water vapor. That is, in this water vapor removing method, a surface area of a portion that cools the gas containing water vapor increases more than in the water vapor removing method according to Aspect 13. Therefore, this condensation device can cool the gas containing water vapor more quickly, due to the increase in contact area.

(Aspect 15)

A flux recovery method according to Aspect 15 comprises the steps of separating flux from a gaseous mixture containing flux by use of water, and generating gas containing water vapor and water containing flux, separating flux from the water containing flux, and recovering flux, and removing water vapor from the generated gas containing water vapor by the water vapor removing method according to Aspect 13 or Aspect 14.

The flux recovery method according to Aspect 15 further comprises the steps of removing water vapor by the water vapor removing method according to Aspect 13. Consequently, water vapor can be removed from a larger amount of gas without making a size of a device for use in the flux recovery method according to Aspect 15 larger than in the related art.

(Aspect 16)

A solder processing method according to Aspect 16 comprises the steps of performing solder processing in a solder processing unit, recovering flux from a gaseous mixture containing flux that is generated by the solder processing, by the flux recovery method according to Aspect 15, and supplying, to the solder processing unit, gas from which water vapor is removed, the gas being generated by the flux recovery method.

The solder processing method according to Aspect 16 further comprises the steps of recovering flux by the flux recovery method according to Aspect 15. Consequently, water vapor can be removed from a larger amount of gas without making a size of a device for use in the solder processing method according to Aspect 16 larger than in the related art.

Advantageous Effects of Invention

According to the present invention, water vapor can be removed from a larger amount of gas without making a size larger than in related art.

DESCRIPTION OF EMBODIMENTS

Hereinafter, description will be made as to embodiments of the present invention with reference to the drawings. In the drawings described below, the same or corresponding constituent component is denoted with the same reference sign and description thereof will not be repeated.

First Embodiment (Entire Configuration)

Figure 1:
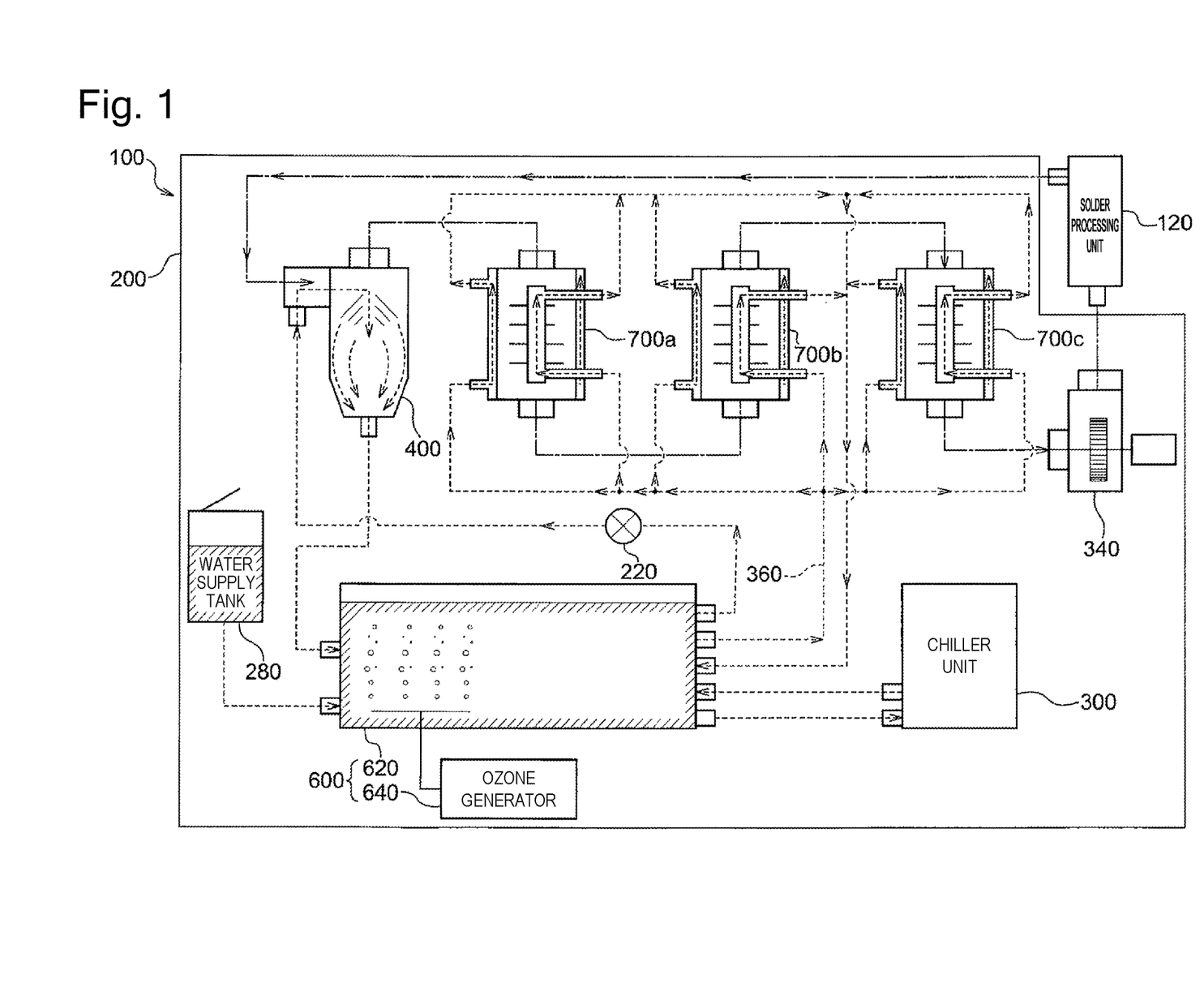
FIG. 1 is a structure diagram of a soldering device comprising a condensation device according to a first embodiment of the present invention.

FIG. 1 is a structure diagram of a soldering device comprising a condensation device according to a first embodiment of the present invention. With reference to FIG. 1, a soldering device 100 comprises a solder processing unit 120 and a flux recovery device 200. The soldering device 100 is a device that solders an electronic component to a circuit board as an example.

Hereinafter, respective constituent components of the soldering device 100 will be described separately.

The solder processing unit 120 performs a process related to soldering, such as a process of soldering an electronic component to a circuit board, or a process of preheating the circuit board, as an example. In the solder processing unit 120, the circuit board to which flux is applied is used to smoothly perform the soldering. Consequently, through the soldering process or the preheating of the circuit board, flux vaporizes, and floats in an interior of the solder processing unit 120. That is, the interior of the solder processing unit 120 is filled with a gaseous mixture containing a flux component. Note that in the present description, the gaseous mixture is gas in which gaseous flux generated during solder processing is mixed with gas that exists from beginning in the solder processing unit 120.

The flux recovery device 200 is a device that recovers flux from the gaseous mixture containing the flux component. The flux recovery device 200 is connected to the solder processing unit 120. Then, the flux recovery device 200 can recover flux from the gaseous mixture in the interior of the solder processing unit 120, and supply, to the solder processing unit 120, gas from which flux is recovered. The flux recovery device 200 comprises, as an example, a separation unit 400, a purification device 600, a pump 220, a water supply tank 280, a chiller unit 300, three condensation devices 700a, 700b, and 700c, a blower 340 and a piping 360. Note that in FIG. 1, to simplify the drawing, the piping through which liquid is distributed is shown as a dotted line, and the piping through which gas is distributed is shown as a dashed line.

The separation unit 400 fluid-communicates with the solder processing unit 120, and can suction the gaseous mixture from the solder processing unit 120. Also, the separation unit 400 has a function of separating flux from the suctioned gaseous mixture by a known method. More specifically, the separation unit 400 mixes water with the gaseous mixture. Consequently, flux contained in the gaseous mixture is cooled by water. The cooled flux is liquefied or solidified. Thus, flux contained in the gaseous mixture is separated, and flux is removed from the gaseous mixture. Also, liquefied or solidified flux is coated with water used in the separation of flux, and discharged from the separation unit 400.

The condensation device 700a, the condensation device 700b and the condensation device 700c have the same configuration as an example. The condensation device 700a fluid-communicates with the separation unit 400, the condensation device 700b fluid-communicates with the condensation device 700a, and the condensation device 700c fluid-communicates with the condensation device 700b. That is, three condensation devices 700a, 700b and 700c are connected to one another. When the gas from which flux is removed in the separation unit 400 is supplied to the condensation device 700a, the gas from which flux is removed passes through the three condensation devices 700a, 700b, and 700c in order, and is discharged from the condensation device 700c. The condensation device 700c fluid-communicates with the blower 340, and the gas discharged from the condensation device 700c is supplied to the blower 340.

The separation unit 400 separates flux from the gaseous mixture by use of water as described above. Consequently, the gas from which flux is removed in the separation unit 400 contains a lot of water vapor. The condensation devices 700a, 700b and 700c have a function of removing water vapor from the gas containing water vapor. Also, the three condensation devices 700a, 700b and 700c are arranged to extend in a gravity direction as an example. That is, an axis L of an inner cooling unit 740 described later extends in the gravity direction (see FIG. 4). Note that detailed configurations of the condensation devices 700a, 700b and 700c will be described later.

The blower 340 has a function of suctioning, from the condensation device 700c, the gas from which water vapor is removed, and blowing, to the solder processing unit 120, the gas from which water vapor is removed.

The purification device 600 fluid-communicates with the separation unit 400. Consequently, the water containing flux that is discharged from the separation unit 400 is supplied to the purification device 600. Also, the purification device 600 includes a purification tank 620 and an ozone generator 640 as an example. The purification device 600 stores the supplied water containing flux in the purification tank 620. Further, the ozone generator 640 supplies bubbles of ozone to the purification tank 620. Consequently, the purification device 600 decomposes flux by use of ozone. Afterward, the purification device 600 passes the water containing decomposition of flux through a filter. Thus, the decomposition is adsorbed on the filter, and hence the purification device 600 can separate flux from the water containing flux, to purify water.

Further, the purification device 600 fluid-communicates with the separation unit 400 via the pump 220. Consequently, the pump 220 can supply, to the separation unit 400, water purified in the purification device 600.

The piping 360 connects the purification device 600 to the three condensation devices 700a, 700b, and 700c. Consequently, the piping 360 can supply the water purified by separating flux in the purification device 600 from the purification device 600 to the condensation devices 700a, 700b, and 700c.

The chiller unit 300 is attached to the purification device 600. The chiller unit 300 can cool the water purified in the purification device 600, and return the water to the purification device 600 again. Consequently, a temperature of the water purified and stored in the purification device 600 is about 5 degrees centigrade as an example.

Water that comes short while being circulated is supplied from the water supply tank 280 to the purification tank 620.

(Condensation Device)

Figure 2:
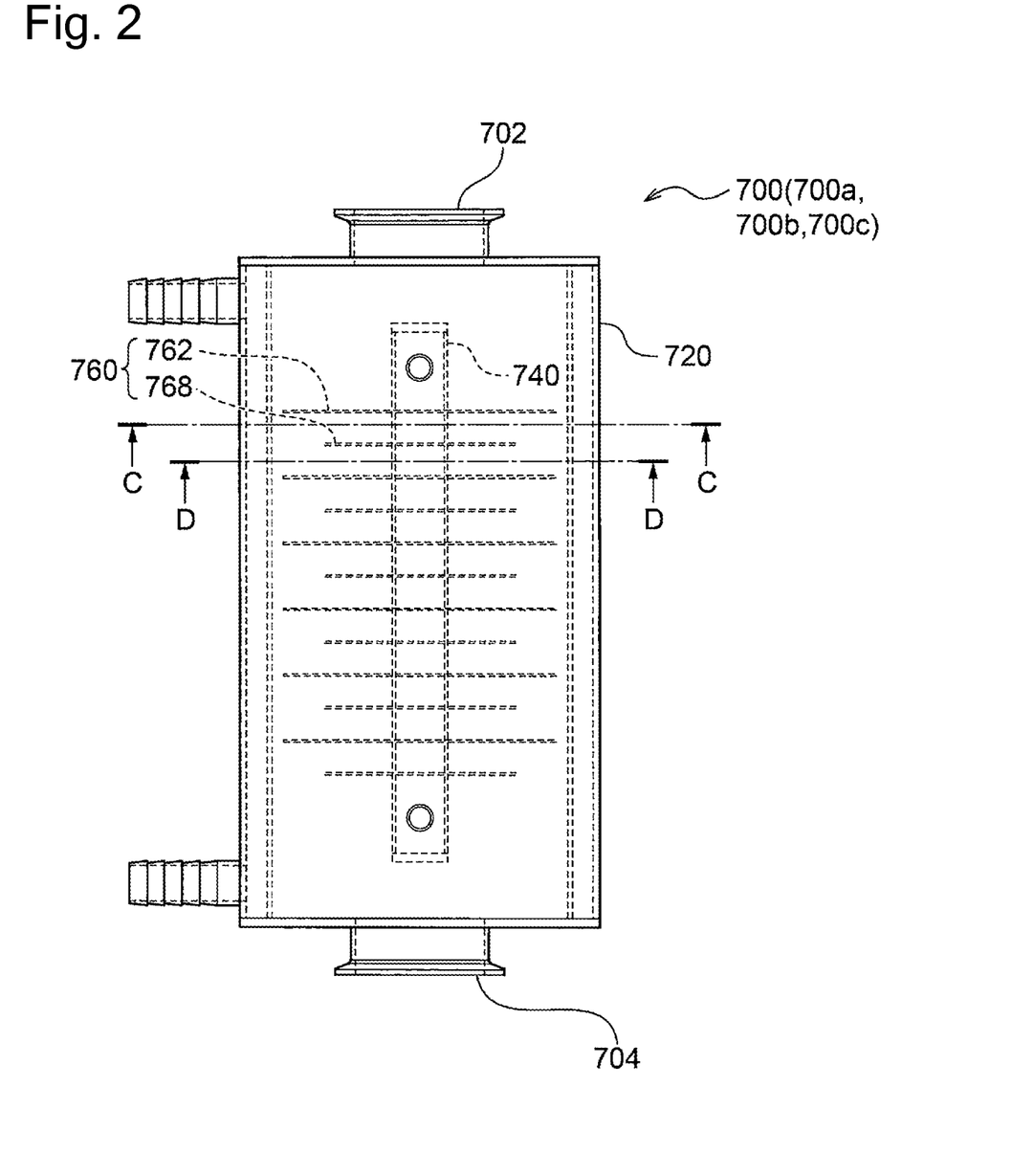
FIG. 2 is a front view showing a configuration of the condensation device shown in FIG. 1.
Figure 3:
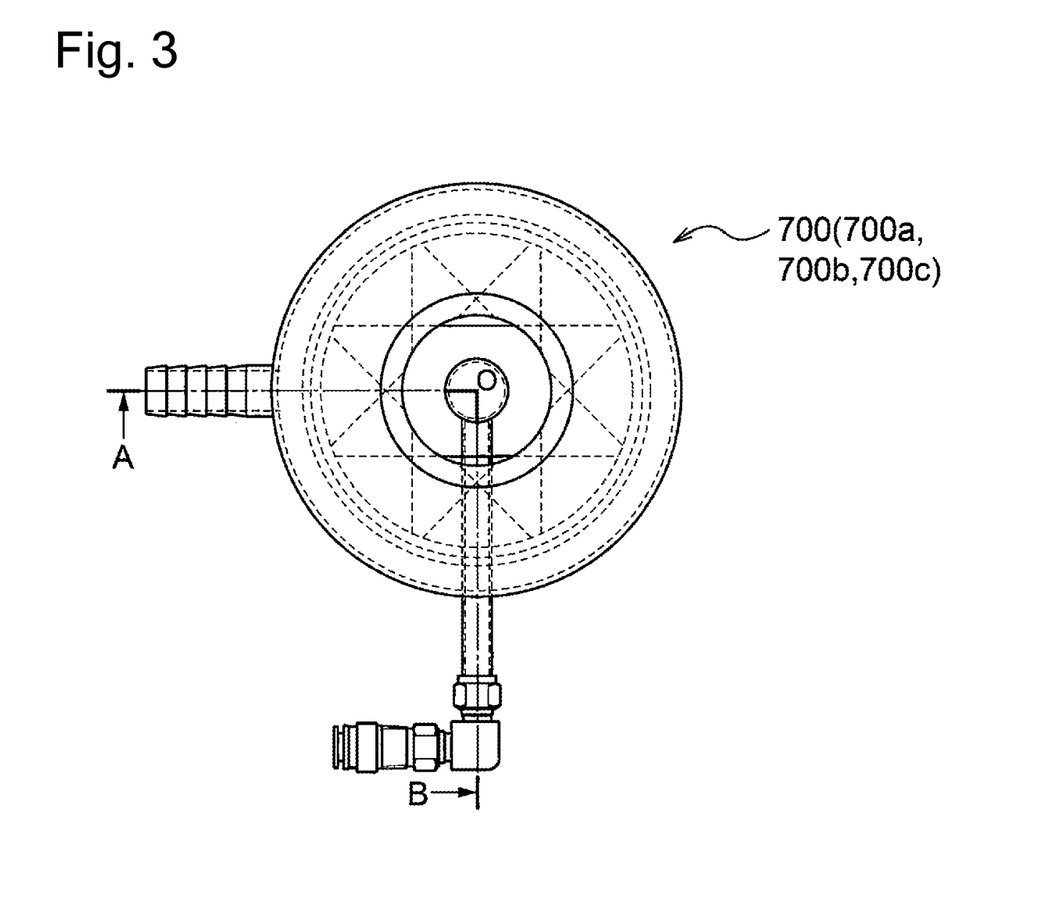
FIG. 3 is a plan view of the condensation device shown in FIG. 2.
Figure 4:
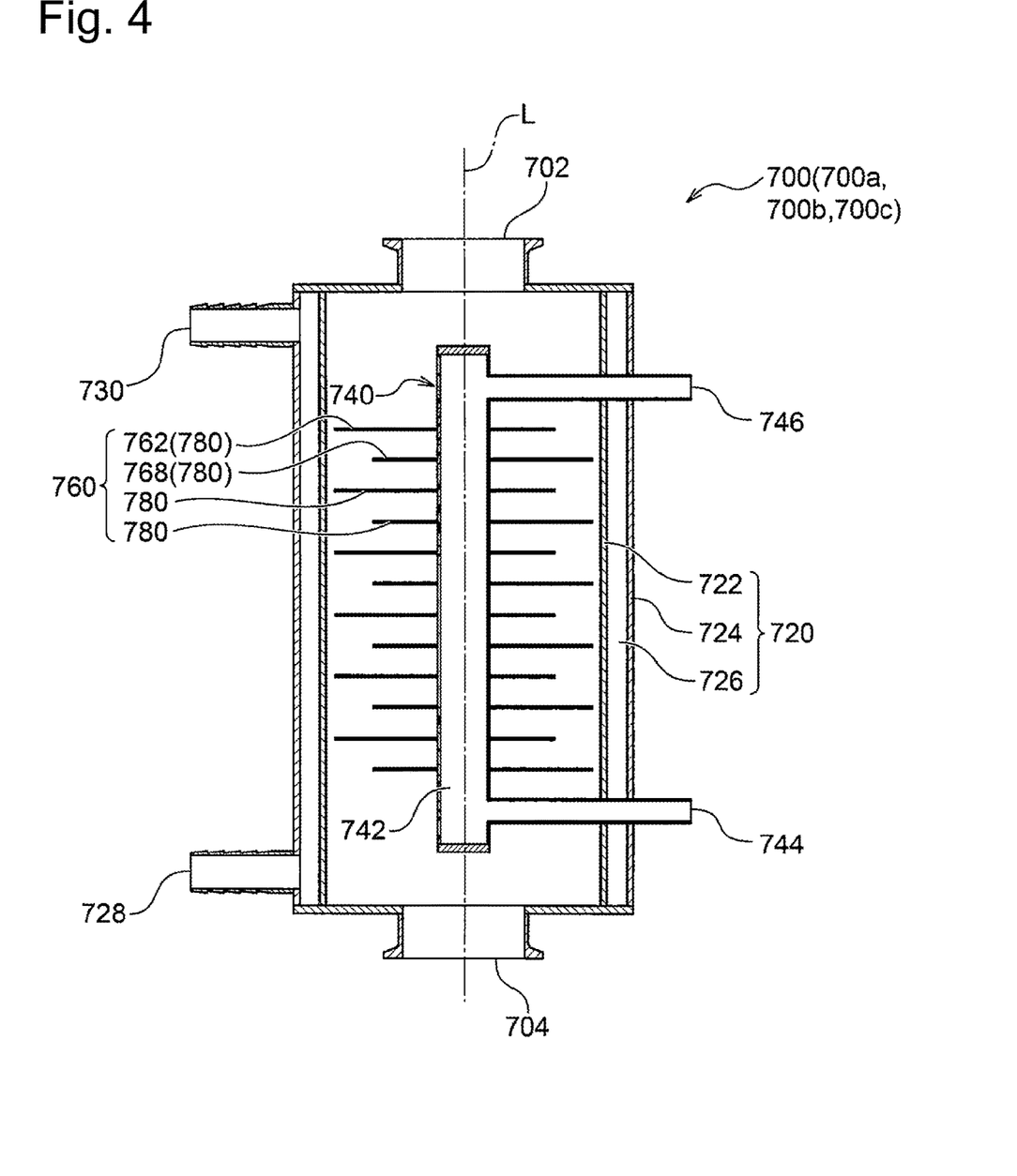
FIG. 4 is a cross-sectional view of the condensation device taken along the A-O-B line shown in FIG. 3.
Figure 5:
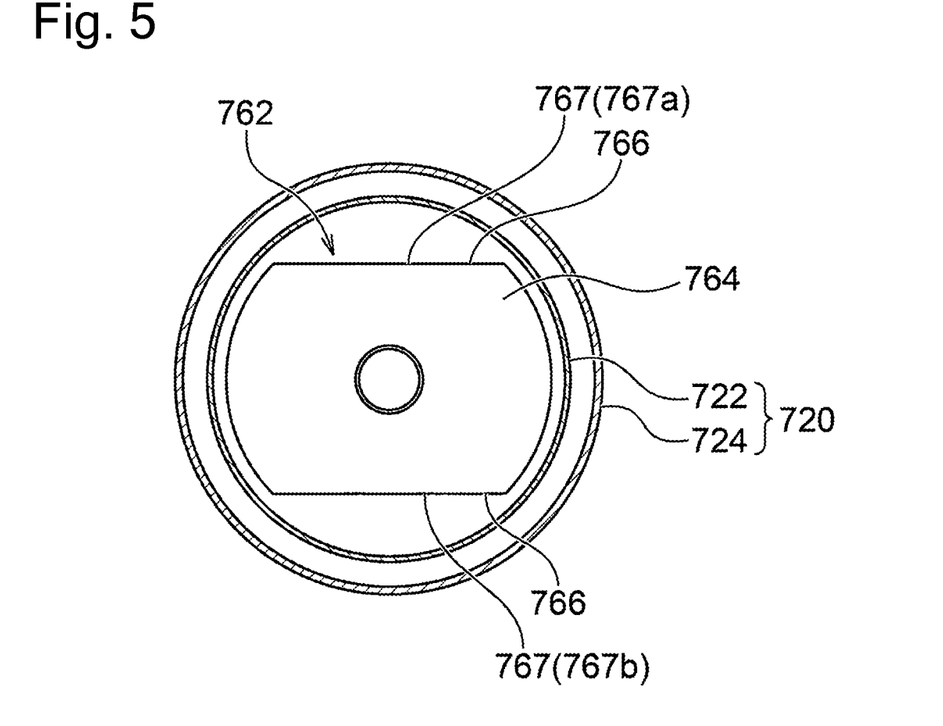
FIG. 5 is a cross-sectional view of the condensation device taken along the C-C line shown in FIG. 2.
Figure 6:
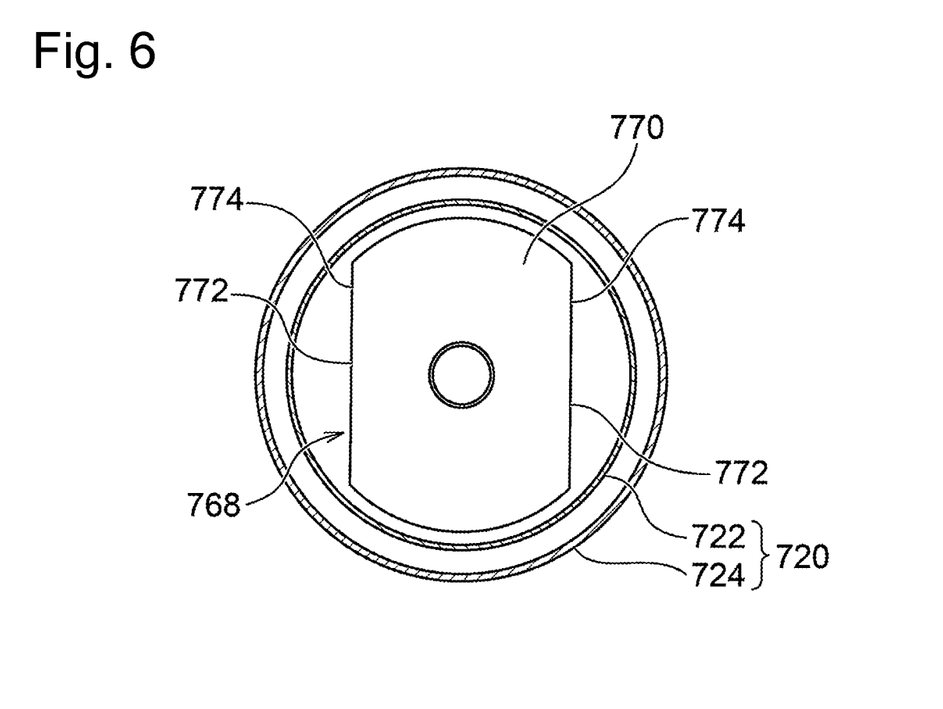
FIG. 6 is a cross-sectional view of the condensation device taken along the D-D line shown in FIG. 2.

Next, description will be made as to more detailed configuration of the condensation devices 700a, 700b, and 700c with reference to FIG. 2 to FIG. 6. Since the condensation devices 700a, 700b and 700c have the same configuration, the condensation devices 700a, 700b and 700c are represented and described as a condensation device 700. FIG. 2 is a front view showing a configuration of the condensation device 700 shown in FIG. 1. FIG. 3 is a plan view of the condensation device 700 shown in FIG. 2. FIG. 4 is a cross-sectional view of the condensation device 700 taken along the A-O-B line shown in FIG. 3. FIG. 5 is a cross-sectional view of the condensation device 700 taken along the C-C line shown in FIG. 2. Further, FIG. 6 is a cross-sectional view of the condensation device 700 taken along the D-D line shown in FIG. 2.

With reference to FIG. 2, the condensation device 700 includes an outer cooling unit 720, the inner cooling unit 740, a heat absorption member 760, a gas inlet 702 and a gas outlet 704. The condensation device 700 has a tubular shape as an example, as seen from FIG. 2 and FIG. 3.

With reference to FIG. 4, the outer cooling unit 720 includes an inner tube 722, an outer tube 724 located outside the inner tube 722, a first flow path 726 through which a first cooling medium passes between the inner tube 722 and the outer tube 724, a first cooling medium inlet 728, and a first cooling medium outlet 730. As an example, the first cooling medium inlet 728 is located below the first cooling medium outlet 730 in the gravity direction. In addition, water supplied from the purification device 600 is supplied from the first cooling medium inlet 728 to the first flow path 726, and discharged from the first cooling medium outlet 730. Afterward, the discharged water is returned to the purification device 600. Therefore, water supplied from the purification device 600 is for use as the first cooling medium. Also, the inner tube 722 of the outer cooling unit 720 extends in an extending direction of the axis L as an example.

The inner cooling unit 740 is located inside the inner tube 722 of the outer cooling unit 720, and includes a second flow path 742 through which a second cooling medium passes, a second cooling medium inlet 744, and a second cooling medium outlet 746. Also, the inner cooling unit 740 has, as an example, a straight tube shape around the axis L as a central axis. Further, as an example, the second cooling medium inlet 744 is located below the second cooling medium outlet 746 in the gravity direction. In addition, water supplied from the purification device 600 is supplied from the second cooling medium inlet 744 to the second flow path 742, and discharged from the second cooling medium outlet 746. Afterward, the discharged water is returned to the purification device 600. Therefore, the water supplied from the purification device 600 is used as the second cooling medium.

The heat absorption member 760 is located inside the inner tube 722 of the outer cooling unit 720 and outside the inner cooling unit 740, and comes in contact with the inner cooling unit 740. The heat absorption member 760 includes a first fin 762 and a second fin 768 as an example. The first fin 762 has a thin plate shape extending in a direction intersecting the axis L of the inner cooling unit 740. Also, the first fin 762 has a shape in which two bow-shaped cutouts 766 symmetrical around a center are formed in a thin disc shape 764 (see FIG. 5). An outer shape of the thin disc shape 764 of the first fin 762 has a value larger than a value obtained by multiplying a value of the inner tube 722 of the outer cooling unit 720 by 0.9 as an example. In addition, two chords 767*a* and 767*b* forming a bow shape of each cutout 766 of the first fin 762 extend in the same direction, because two cutouts 766 are formed symmetrically around the center. On the other hand, the second fin 768 is disposed adjacent to the first fin 762 via a space, and located on a downstream side of the first fin 762 (see FIG. 4). Further, the second fin 768 has the same shape as in the first fin 762 (see FIG. 6). That is, the second fin 768 has a shape in which two bow-shaped cutouts 772 symmetrical around a center are formed in a thin disc shape 770.

Further, in the condensation device 700, as an example, an extending direction of a chord 767 of the first fin 762 is different from an extending direction of a chord 774 forming a bow shape of each cutout 772 of the second fin 768 (see FIG. 2, FIG. 5 and FIG. 6). In more detail, the extending direction of the chord 767 is different from the extending direction of the chord 774 by 90 degrees.

Further, the heat absorption member 760 includes a plurality of fins 780 as an example (see FIG. 4). Each of the first fin 762 and the second fin 768 is an example of the fins 780. In addition, the first fin 762 is located on a most upstream side among the fins 780. Furthermore, all the fins 780 included in the heat absorption member 760 have the same shape as an example. That is, each fin 780 has a shape in which two bow-shaped cutouts symmetrical around the center are formed in the thin disc shape. Further, an extending direction of a chord forming the cutout of the fin 780 at an odd-numbered position counted from an upstream side is equal to the extending direction of the chord 767 of the first fin 762. That is, all the fins 780 at odd-numbered positions counted from the upstream side face in the same direction. On the other hand, an extending direction of a chord forming a cutout of the fin 780 at an even-numbered position counted from the upstream side is equal to the extending direction of the chord 774 of the second fin 768. That is, all the fins 780 at even-numbered positions counted from the upstream side face in the same direction. In addition, the fin 780 is made of aluminum, copper, iron, another metal with a high thermal conductivity, or the like as an example. Also, in the present description, in a case where gas flowing through a first point flows through a second point after flowing through the first point, the first point is defined on an upstream side of the second point, and the second point is defined on a downstream side of the first point.

Through the gas inlet 702, the gas containing water vapor is introduced into the inner tube 722 of the outer cooling unit 720.

Through the gas outlet 704, the gas from which water vapor is removed is discharged from the inner tube 722 of the outer cooling unit 720. The gas inlet 702 is located above the gas outlet 704 in the gravity direction as an example, and the gas inlet 702 may be located below the gas outlet 704 in the gravity direction.

<Operation>

Next, description will be made as to an operation of the soldering device 100.

First, the soldering device 100 performs the solder processing in the solder processing unit 120 (see FIG. 1). In this case, since the circuit board to which flux is applied is used, flux vaporizes, and the interior of the solder processing unit 120 is filled with the gaseous mixture containing the flux component.

Next, the separation unit 400 suctions the gaseous mixture from the solder processing unit 120. Then, the separation unit 400 separates flux from the gaseous mixture containing flux by use of water, and generates the gas containing water vapor and the water containing flux. Afterward, the water containing flux is conveyed from the separation unit 400 to the purification device 600, and the purification device 600 separates flux, and recovers flux. On the other hand, the gas containing water vapor is conveyed to the condensation device 700*a*, and enters an interior of the inner tube 722 of the outer cooling unit 720 through the gas inlet 702 (see FIG. 4).

At this time, in the condensation device 700*a*, water that is the first cooling medium passes through the first flow path 726 of the outer cooling unit 720, and water that is the second cooling medium passes through the second flow path 742 of the inner cooling unit 740. Consequently, surface temperatures of the outer cooling unit 720 and inner cooling unit 740 drop down to temperatures at which water can condense from the gas containing water vapor. Also, the heat absorption member 760 comes in contact with the inner cooling unit 740, and hence a surface temperature of the heat absorption member 760 also drops down to a temperature at which water can condense from the gas containing water vapor. Thus, the outer cooling unit 720, the inner cooling unit 740 and the heat absorption member 760 can cool the gas flowing through the interior of the inner tube 722 of the outer cooling unit 720. Then, in the interior of the inner tube 722, the water vapor contained in the gas condenses. Consequently, the water vapor contained in the gas is removed.

Afterward, the gas from which water vapor is removed in the condensation device 700*a* passes through the condensation device 700*b* and the condensation device 700*c*. At this time, the gas from which water vapor is removed in the condensation device 700*a* further has the water vapor removed by the condensation device 700*b* and the condensation device 700*c* in the same manner as when passing through the condensation device 700*a*. Then, the gas from which water vapor is removed after passing through the condensation device 700*c* is suctioned into the blower 340. Afterward, the blower 340 blows the gas from which water vapor is removed to the solder processing unit 120.

Operations and Effects

Next, description will be made below as to operations and effects of the condensation device 700, the soldering device 100 and the flux recovery device 200 according to the present embodiment.

(First Effect)

In the condensation device 700, as described above, the gas flowing through the interior of the inner tube 722 of the outer cooling unit 720 can be cooled by the outer cooling unit 720, the inner cooling unit 740, and the heat absorption member 760. Consequently, in the condensation device 700, a surface area of a portion that cools the gas containing water vapor increases as compared with a condensation device described in PTL 1. Therefore, in a case where the condensation device 700 removes water vapor from gas with the same flow rate as in the condensation device described in PTL 1, a size of the device can be made smaller than that of the condensation device described in PTL 1. Also, in a case where the condensation device 700 has the same size as in the condensation device described in PTL 1, water vapor can be removed from a larger amount of gas.

(Second Effect)

In the condensation device 700, the heat absorption member 760 includes the plurality of fins 780. Consequently, the condensation device 700 can increase a contact area of the heat absorption member 760 more than with one fin 780. Therefore, the condensation device 700 can cool the gas containing water vapor more quickly due to the increase in contact area.

(Third Effect)

The gas flowing in the vicinity of the inner tube 722 of the outer cooling unit 720, the inner cooling unit 740 and the heat absorption member 760 is cooled more than gas flowing through a position away from the inner tube 722 of the outer cooling unit 720, the inner cooling unit 740 and the heat absorption member 760. Consequently, if it is considered that convection of the gas containing water vapor does not occur in the interior of the inner tube 722 of the outer cooling unit 720, a difference in temperature of gas to be discharged might be made depending on a position through which the gas containing water vapor flows. In this case, there is concern that gas that is not cooled and still contains a lot of water vapor passes through the condensation device 700.

However, in the condensation device 700, the first fin 762 is disposed to extend in the direction intersecting the axis L of the inner cooling unit 740. That is, the first fin 762 is oriented to block the flow of the gas containing water vapor. Consequently, when the gas containing water vapor collides with the first fin 762, the convection of gas occurs in the interior of the inner tube 722 of the outer cooling unit 720. In consequence, the condensation device 700 can uniformly cool the gas containing water vapor. That is, the condensation device 700 can inhibit the gas still containing a lot of water vapor from being passed through the condensation device 700.

(Fourth Effect)

In the condensation device 700, it is assumed that the first fin 762 and the second fin 768 are arranged so that the extending direction of the chord 767 of the first fin 762 is equal to the extending direction of the chord 774 of the second fin 768. In this case, when gas passing through a portion of the first fin 762 in which the cutout 766 is formed flows straight forward, the gas passes through a portion of the second fin 768 in which the cutout 772 is formed. Consequently, wind is hard to flow between the first fin 762 and the second fin 768, and gas between the first fin 762 and the second fin 768 might stay. Thus, gas stays between the first fin 762 and the second fin 768, this gas is only cooled, gas at another position might be hard to cool.

However, according to the condensation device 700, the extending direction of the chord 767 of the first fin 762 is different from the extending direction of the chord 774 of the second fin 768 (see FIG. 2, FIG. 5 and FIG. 6). Therefore, in a case where gas passing through a portion of the first fin 762 in which the cutout 766 is formed flows straight forward, this gas collides with the second fin 768. This causes the convection of gas between the first fin 762 and the second fin 768. That is, the gas between the first fin 762 and the second fin 768 is inhibited from staying. Therefore, the condensation device 700 can make uniform a temperature of gas in the vicinity of the first fin 762 and the second fin 768.

<Modifications>

Next, description will be made below as to modifications of the condensation device 700 and the flux recovery device 200 according to the present embodiment.

(First Modification)

In the condensation device 700, the heat absorption member 760 is in contact with the inner cooling unit 740. However, the heat absorption member 760 may be in contact with at least one of the outer cooling unit 720 and the inner cooling unit 740. This is because the heat absorption member 760 can cool gas passing through the inner tube 722 of the outer cooling unit 720, as long as the heat absorption member 760 can be cooled by the outer cooling unit 720 or the inner cooling unit 740.

(Second Modification)

Also, in the condensation device 700, the inner cooling unit 740 has the straight tube shape. However, the inner cooling unit 740 may have a shape such as a spherical shape or a cube shape. This is because the inner cooling unit 740 can cool the gas passing through the inner tube 722 of the outer cooling unit 720, and the heat absorption member 760, even if the inner cooling unit 740 has any shape.

(Third Modification)

Further, in the condensation device 700, the heat absorption member 760 includes a plurality of fins 780, but the heat absorption member 760 may include only one fin 780. Alternatively, the heat absorption member 760 may include the fin 780 in which one or three or more bow-shaped cutouts are formed in a thin disc shape, or may comprise the fin 780 having any other shape. This is because the heat absorption member 760 can cool passing gas, as long as the included fins 780 can come in contact with the gas passing through the inner tube 722 of the outer cooling unit 720 regardless of the shape or number of the fins.

(Fourth Modification)

Water supplied from the purification device 600 is used as the first cooling medium and the second cooling medium. However, in the condensation device 700, any low-temperature liquid may be used as the first cooling medium or the second cooling medium, as long as the gas passing through the inner tube 722 of the outer cooling unit 720 is cooled and condensation can occur in the interior of the inner tube 722.

Second Embodiment (Condensation Device)

Figure 7:
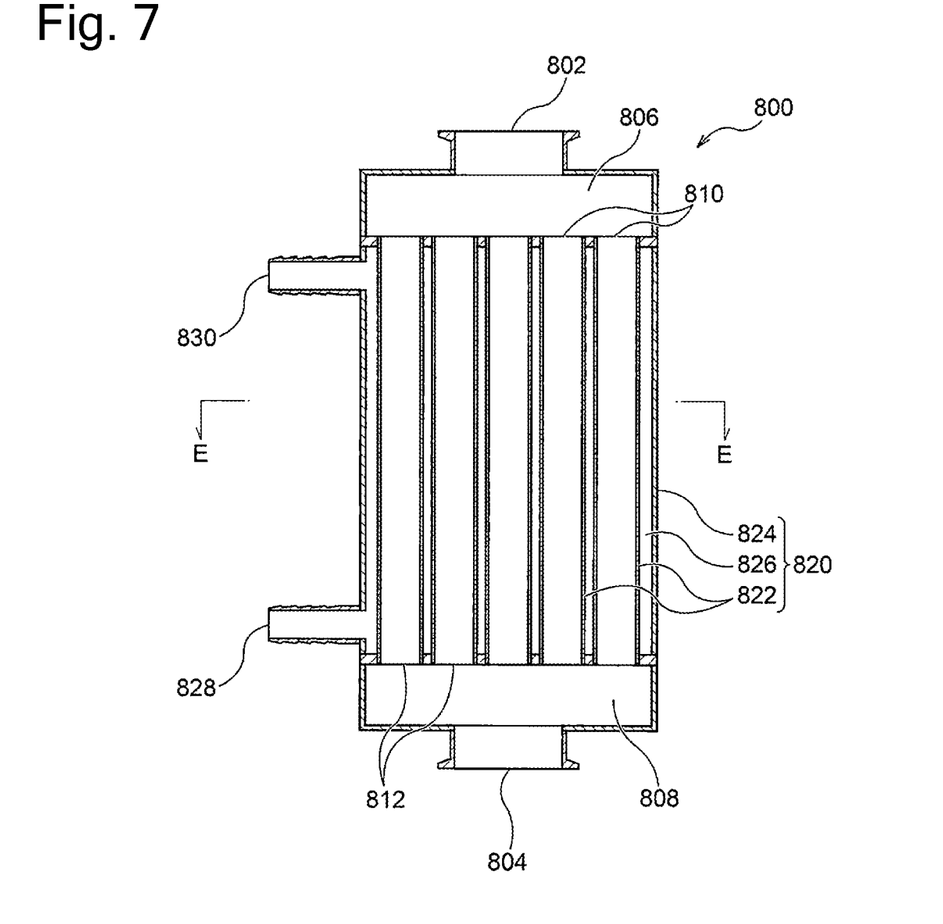
FIG. 7 is a structure diagram of a condensation device according to a second embodiment of the present invention.
Figure 8:
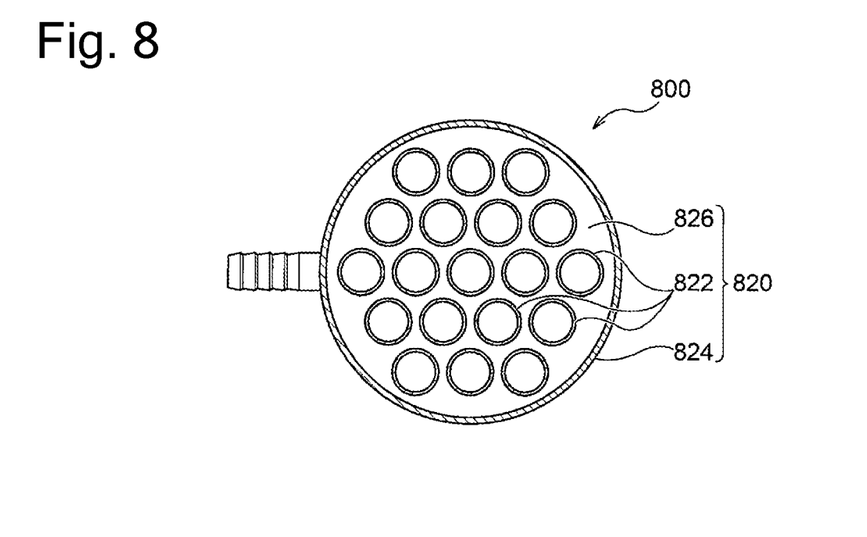
FIG. 8 is a cross-sectional view of the condensation device taken along the E-E line shown in FIG. 7.

FIG. 7 is a structure diagram of a condensation device according to a second embodiment of the present invention. FIG. 8 is a cross-sectional view of the condensation device taken along the E-E line shown in FIG. 7.

With reference to FIG. 7, a condensation device 800 includes an outer cooling unit 820, a gas inlet 802, a gas outlet 804, a distributary chamber 806 and a confluence chamber 808. The condensation device 800 has a tubular shape as an example as seen from FIG. 7 and FIG. 8. In addition, the condensation device 700 according to the first embodiment is replaced with the condensation device 800 according to the present embodiment as an example for use in the flux recovery device 200 and the soldering device 100.

With reference to FIG. 7, the outer cooling unit 820 includes a plurality of inner tubes 822, an outer tube 824 located outside the inner tubes 822, a first flow path 826 through which a first cooling medium passes between the inner tube 822 and the outer tube 824, a first cooling medium inlet 828, and a first cooling medium outlet 830. As an example, the first cooling medium inlet 828 is located below the first cooling medium outlet 830 in a gravity direction. In addition, water supplied from a purification device 600 is supplied from the first cooling medium inlet 828 to the first flow path 826, and discharged from the first cooling medium outlet 830. Afterward, the discharged water is returned to the purification device 600. Therefore, the water supplied from the purification device 600 is for use as the first cooling medium.

The gas inlet 802 fluid-communicates with respective inner tube inlets 810 via the distributary chamber 806. Consequently, the gas containing water vapor that is supplied to the gas inlet 802 is branched in the distributary chamber 806, and supplied to the respective inner tubes 822 via the respective inner tube inlets 810.

The gas outlet 804 fluid-communicates with respective inner tube outlets 812 via the confluence chamber 808. Consequently, gases from which water vapor is removed and that are discharged from respective gas outlets 804 join in the confluence chamber 808, and are discharged from the gas outlet 804.

Operations and Effects

Next, description will be made below as to operations and effects of the condensation device 800 according to the present embodiment.
(First Effect)

The condensation device 800 can cool gas flowing through interiors of a plurality of inner tubes 822 by the outer cooling unit 820. In particular, the condensation device 800 includes the plurality of inner tubes 822, and hence can cool gas containing water vapor more quickly than in a case where the device includes one inner tube 822.
<Modifications>

Next, description will be made below as to modifications of the condensation device 800 according to the present embodiment.
(First Modification)

The condensation device 800 comprises the plurality of inner tubes 822. However, the condensation device 800 may comprise one inner tube 822 in place of the plurality of inner tubes 822. This is because, also in this case, the condensation device 800 can cool the gas flowing through an interior of one inner tube 822 by the one inner tube 822 of the outer cooling unit 820. That is, when the condensation device 800 comprises one or two or more inner tubes 822, water vapor can be removed from gas.
(Second Modification)

The condensation device 800 may comprise an inner cooling unit located inside at least one of a plurality of inner tubes 822 as in the condensation device 700 of the first embodiment. This is because, in this case, the condensation device 800 can cool the gas flowing through an interior of the inner tube 822 by the outer cooling unit 820 and the inner cooling unit.
(Third Modification)

The condensation device 800 may comprise, inside at least one of the plurality of inner tubes 822, a heat absorption member that comes in contact with the inner tube 822. This is because, in this case, the condensation device 800 can cool the gas flowing through an interior of the inner tube 822 by the outer cooling unit 820 and the heat absorption member.

The embodiments of the present invention and the respective modifications according to the embodiments have been described above, and needless to say, the respective examples have been described above to facilitate understanding of the present invention, and do not intend to restrict the present invention. The present invention can be appropriately changed and modified without departing from the scope, and the present invention includes equivalents to the invention. Also, in a range in which at least some of the above-described problems can be solved or a range in which at least some of effects are exhibited, any arbitrary combination or omission of the respective constituent components described in claims and description is possible.

REFERENCE SIGNS LIST

100: soldering device
120: solder processing unit
200: flux recovery device
220: pump
280: water supply tank
300: chiller unit
340: blower
360: piping
400: separation unit
600: purification device
620: purification tank
640: ozone generator
700, 700a, 700b, 700c and 800: condensation device
702 and 802: gas inlet
704 and 804: gas outlet
806: distributary chamber
808: confluence chamber
720 and 820: outer cooling unit
722 and 822: inner tube
724 and 824: outer tube
726 and 826: first flow path
740: inner cooling unit
742: second flow path
760: heat absorption member
762: first fin
768: second fin
780: fin

The invention claimed is:

1. A flux recovery device that recovers flux from a gaseous mixture containing a flux component, the flux recovery device comprising:
  a condensation device comprising:
  an outer cooling unit including two or more inner tubes, an outer tube located outside the two or more inner tubes, and a first flow path through which a first cooling medium passes between the two or more inner tubes and the outer tube, wherein the two or more inner tubes have a shape of a cylinder
  a purification device to which the water containing flux is supplied, and that separates flux from the water containing flux, and recovers flux
  a piping that supplies water separated from flux and purified in the purification device from the purification device to the condensation device and
  a separation unit that separates flux from the gaseous mixture by use of water, and discharges gas containing water vapor and water containing flux, wherein the outer cooling unit includes a first cooling medium inlet, and a first cooling medium outlet, wherein the first cooling medium is configured to be supplied from the first cooling medium inlet to the first flow path, and discharged from the first cooling medium outlet, and wherein the first cooling medium outlet is in fluid communication with the purification device without passing through the separation unit.

2. The flux recovery device according to claim 1, wherein the outer tube has a shape of a cylinder.

3. The flux recovery device according to claim 1, wherein the first cooling medium inlet is located below the first cooling medium outlet in a gravity direction.

4. The flux recovery device according to claim 1, wherein the condensation device further comprises:
a heat absorption member that is located inside at least one inner tube in the two or more inner tubes, and that comes in contact with the outer cooling unit.

5. The flux recovery device according to claim 1, wherein the condensation device further comprises:
an inner cooling unit located inside the two or more inner tubes and including a second flow path through which a second cooling medium passes.

6. The flux recovery device according to claim 5, wherein the condensation device further comprises:
a heat absorption member that is located inside the two or more inner tubes and outside the inner cooling unit, and that comes in contact with the inner cooling unit.

7. The flux recovery device according to claim 6, wherein the heat absorption member includes a plurality of fins.

8. The flux recovery device according to claim 6, wherein the inner cooling unit has a straight tube shape,
the inner tube of the outer cooling unit extends in an axial direction of the straight tube shape of the inner cooling unit, and
the heat absorption member includes a first fin having a thin plate shape extending in a direction intersecting the axis.

9. The flux recovery device according to claim 8, wherein the first fin has a shape in which a bow-shaped cutout is formed in a thin disc shape,
the heat absorption member further comprises a second fin having the same shape as in the first fin, disposed adjacent to the first fin via a space, and located on a downstream side of the first fin, and
an extending direction of a chord forming the bow shape of the cutout in the first fin is different from an extending direction of a chord forming a bow shape of a cutout in the second fin.

10. The flux recovery device according to claim 1, wherein the purification device is configured to be supplied with the water containing flux that is discharged from the separation unit.

11. The flux recovery device according to claim 10, wherein the condensation device further includes an inner cooling unit located inside the two or more inner tubes and including a second flow path through which a second cooling medium passes, and wherein at least one of the first cooling medium and the second cooling medium is water supplied from the purification device.

12. The flux recovery device according to claim 10, further comprising:
a pump that supplies the water purified in the purification device to the separation unit,
a chiller unit that cools the water purified in the purification device, and a blower that blows, from the condensation device, the gas from which water vapor is removed in the condensation device.

13. The flux recovery device according to claim 1, comprising:
a plurality of the condensation devices connected to one another.

14. A soldering device comprising:
a solder processing unit, and
the flux recovery device according to claim 1 that recovers flux from a gaseous mixture containing flux generated in the solder processing unit.

15. A water vapor removing method comprising the steps of:
allowing a first cooling medium to pass through a first flow path between two or more inner tubes and an outer tube in an outer cooling unit including the two or more inner tubes and the outer tube located outside the two or more inner tubes,
allowing, in interiors of the two or more inner tubes, condensation of water vapor contained in gas flowing through the interiors of the two or more inner tubes, to remove water vapor contained in the gas, and
allowing the water that separated from flux and purified in a purification device to be supplied from the purification device to the condensation device as the first cooling medium,
wherein the two or more inner tubes have a shape of a cylinder,
wherein the outer cooling unit includes a first cooling medium inlet, and a first cooling medium outlet,
wherein the first cooling medium is configured to be supplied from the first cooling medium inlet to the first flow path, and discharged from the first cooling medium outlet,
wherein the first cooling medium outlet is in fluid communication with the purification device without passing through a separation unit, and
wherein the separation unit is configured to separate flux from the gaseous mixture by use of water, and discharges gas containing water vapor and water containing flux.

16. The water vapor removing method according to claim 15, wherein the outer tube has a shape of a cylinder.

17. The water vapor removing method according to claim 15, wherein
the first cooling medium inlet is located below the first cooling medium outlet in a gravity direction, the method further comprising the steps of:
supplying the first cooling medium from the first cooling medium inlet to the first flow path, and
discharging the first cooling medium from the first cooling medium outlet.

18. The water vapor removing method according to claim 15, further comprising the steps of:
allowing a second cooling medium to pass through a second flow path included in an inner cooling unit located inside the two or more inner tubes, and
cooling, by a heat absorption member, gas flowing through an interior of the inner tube, the heat absorption member being located inside the two or more inner tubes of the outer cooling unit and outside the inner cooling unit, the heat absorption member coming in contact with at least one of the outer cooling unit and the inner cooling unit.

19. A flux recovery method comprising the steps of:
separating flux from a gaseous mixture containing flux by use of water, and generating gas containing water vapor and water containing flux,
separating flux from the water containing flux, and recovering flux, and
removing water vapor from the generated gas containing water vapor by the water vapor removing method according to claim 15.

20. A solder processing method comprising the steps of:
performing solder processing in a solder processing unit,
recovering flux from a gaseous mixture containing flux that is generated by the solder processing, by the flux recovery method according to claim 19, and
supplying, to the solder processing unit, the gas from which water vapor is removed, the gas being generated by the flux recovery method.

21. A flux recovery device that recovers flux from a gaseous mixture containing a flux component, the flux recovery device comprising:
a condensation device comprising:
an outer cooling unit including one or two or more inner tubes, an outer tube located outside the one or two or more inner tubes, and a first flow path through which a first cooling medium passes between the one or two or more inner tubes and the outer tube, and
an inner cooling unit located inside the one or two or more inner tubes and including a second flow path through which a second cooling medium passes
a purification device to which the water containing flux is supplied, and that separates flux from the water containing flux, and recovers flux, and
a piping that supplies water separated from flux and purified in the purification device from the purification device to the condensation device, and
a separation unit that separates flux from the gaseous mixture by use of water, and discharges gas containing water vapor and water containing flux,
wherein the outer cooling unit includes a first cooling medium inlet, and a first cooling medium outlet,
wherein the first cooling medium is configured to be supplied from the first cooling medium inlet to the first flow path, and discharges from the first cooling medium outlet, and
wherein the first cooling medium outlet is in fluid communication with the purification device without passing through the separation unit.

22. A water vapor removing method comprising the steps of:
allowing a first cooling medium to pass through a first flow path between one or two or more inner tubes and an outer tube in an outer cooling unit including the one or two or more inner tubes and the outer tube located outside the one or two or more inner tubes,
allowing, in interiors of the one or two or more inner tubes, condensation of water vapor contained in gas flowing through the interiors of the one or two or more inner tubes, to remove water vapor contained in the gas,
allowing a second cooling medium to pass through a second flow path included in an inner cooling unit located inside the one or two or more inner tubes, and
allowing the water that separated from flux and purified in a purification device to be supplied from the purification device to the condensation device as the first cooling medium
wherein the outer cooling unit includes a first cooling medium inlet, and a first cooling medium outlet,
wherein the first cooling medium is configured to be supplied from the first cooling medium inlet to the first flow path, and discharged from the first cooling medium outlet,
wherein the first cooling medium outlet is in fluid communication with the purification device without passing through a separation unit, and
wherein the separation unit is configured to separate flux from the gaseous mixture by
use of water, and discharges gas containing water vapor and water containing flux.

* * * * *